United States Patent
Lee

(10) Patent No.: US 9,831,001 B2
(45) Date of Patent: Nov. 28, 2017

(54) TEST APPARATUS, TEST SYSTEM AND OPERATING METHOD OF TEST APPARATUS

(71) Applicant: SK hynix Inc., Gyeonggi-do (KR)

(72) Inventor: Yong-Woo Lee, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 244 days.

(21) Appl. No.: 14/732,281

(22) Filed: Jun. 5, 2015

(65) Prior Publication Data

US 2016/0133339 A1    May 12, 2016

(30) Foreign Application Priority Data

Nov. 12, 2014   (KR) .................. 10-2014-0157047

(51) Int. Cl.
  *G11C 29/18*   (2006.01)
  *G11C 29/56*   (2006.01)
(52) U.S. Cl.
  CPC ........ *G11C 29/18* (2013.01); *G11C 29/56004* (2013.01); *G11C 29/56008* (2013.01)
(58) Field of Classification Search
  CPC .............. G11C 29/18; G11C 29/56008; G11C 29/56004; G03R 31/31701; G03R 31/3183; G03R 31/31813
  USPC .............. 714/738, 719, 736, 734, 739, 819; 365/200, 201
  See application file for complete search history.

(56) References Cited

U.S. PATENT DOCUMENTS

| 2001/0024390 | A1* | 9/2001 | Fukuda ................. G11C 29/12 365/200 |
| 2004/0015757 | A1* | 1/2004 | Ohlhoff ................. G11C 29/40 714/719 |
| 2008/0084772 | A1* | 4/2008 | Won ....................... G11C 5/145 365/201 |
| 2011/0179324 | A1* | 7/2011 | Lai ..................... G11C 29/56008 714/723 |

FOREIGN PATENT DOCUMENTS

KR    1020100019332    2/2010

* cited by examiner

*Primary Examiner* — Christine Tu
(74) *Attorney, Agent, or Firm* — IP & T Group LLP

(57) ABSTRACT

A test system may include: a vector storage unit suitable for storing a first test vector corresponding to a first test operation; a test target suitable for performing a test operation corresponding to the test vector stored in a vector storage unit; a comparison unit suitable for comparing a first test result to an expected value to output a first test result value, wherein the first test result is transferred from the test target as a result of the first test operation based on the first test vector; and a vector control unit suitable for modifying the first test vector to generate a second test vector corresponding to a second test operation.

24 Claims, 4 Drawing Sheets

TEST APPARATUS, TEST SYSTEM AND OPERATING METHOD OF TEST APPARATUS

CROSS-REFERENCE TO RELATED APPLICATIONS

The present application claims priority of Korean Patent Application No. 10-2014-0157047, filed on Nov. 12, 2014, which is incorporated herein by reference in its entirety.

BACKGROUND

1. Field

Exemplary embodiments of the present invention relate to a semiconductor design technology and, more particularly, to a test system which performs a test operation on a test target circuit.

2. Description of the Related Art

Semiconductor devices, such as double data rate synchronous DRAM (DDR SDRAM), generally go through many testing operations before being sold commercially. Only semiconductor devices that pass all of the tests are commercialized. Test operations are performed to verify whether a test target circuit, e.g. a semiconductor device, operates normally. There are different tests at each step of the semiconductor fabrication process. The purpose of these tests is to prevent unnecessary fabrication costs by immediately detecting defects that occur at each fabrication step. It is therefore preferable to detect defects in the initial stages of the fabrication process. Therefore, test systems used in the initial stages are generally considered to be the most important.

Most test systems are very expensive so it is often costly to replace them. However, the internal structure and circuit operations of semiconductor devices change rapidly compared to the test systems, so this presents a problem of how to adapt existing test equipment to new, often more complex, devices.

SUMMARY

Various embodiments are directed to a test system capable of efficiently performing a test operation on various test target circuits.

In an embodiment, a test system may include: a vector storage unit suitable for storing a first test vector corresponding to a first test operation; a test target suitable for performing a test operation corresponding to a test vector stored in the vector storage unit; a comparison unit suitable for comparing a first test result to an expected value to output a first test result value, wherein the first test result is transferred from the test target as a result of the first test operation based on the first test vector; and a vector control unit suitable for modifying the first test vector to generate a second test vector corresponding to a second test operation.

A part of bits that form the first test vector may be modified to generate the second test vector.

A test system may further include an expected value control unit suitable for modifying the expected value to correspond to the second test operation.

A part of bits that form the expected value may be modified when the expected value is modified.

A test system may further include a defect detection unit suitable for detecting a defect of a test vector stored in the vector storage unit to generate a control signal for modifying the test vector stored in the vector storage unit.

The test target may include a plurality of transmission lines for coupling a plurality of external input/output terminals to an internal circuit, and the internal circuit includes: a buffering unit suitable for buffering a test vector transmitted through the transmission lines; and a defective line detection unit suitable for detecting coupling states of the transmission lines based on an output signal of the buffering unit.

The first and second test vectors may include a plurality of detection voltages and a select signal for selectively outputting the detection voltages, and the vector control unit controls the select signal to modify the first test vector.

The detection voltages may have different voltage levels.

The test target may include a plurality of transmission lines for coupling a plurality of external input/output terminals to an internal circuit, and the internal circuit includes a selection unit suitable for selectively outputting the detection voltages transmitted through the transmission lines based on the select signal.

In an embodiment, an operating method of a test apparatus may include: initializing the test apparatus to generate a first test vector; performing a first test operation corresponding to the first test vector; modifying the first test vector to generate a second test vector; and performing a second test operation corresponding to the second test vector.

In the modifying of the first test vector, a part of bits that form the first test vector may be modified.

An operation method may further include: comparing the first test vector to a first expected value to generate a first test result value; and comparing the second test vector to a second expected value to generate a first test result value.

The first expected value corresponding to the first test operation may be generated when the test apparatus is initialized.

An operation method may further include: generating the second expected value by modifying the first expected value.

The first test vector may include a plurality of detection voltages and a select signal for selectively outputting the detection voltages, and the second test vector may be obtained by modifying the select signal.

In an embodiment, a test system may include: a semiconductor device including a detection unit suitable for receiving a test vector and detecting a coupling state of a transmission line coupled to the semiconductor device, based on the test vector; and a test apparatus suitable for modifying the test vector based on a design type information of the detection unit, and determining whether the coupling state of the transmission line coupled to the semiconductor device is normal or not, based on the detection result.

The test vector may include multiple bits, and the detection unit combines the bits to output the test vector.

The test vector may include a plurality of detection voltages and a select signal, and the detection unit outputs a corresponding detection voltage based on the select signal for selectively outputting the detection voltages.

The test apparatus may include a vector control unit suitable for modifying a part of the bits.

The test apparatus may include a vector control unit suitable for modifying the select signal.

The transmission lines may be coupled between an internal circuit and a plurality of external input/output terminals of the semiconductor device.

In an embodiment, a test apparatus may include: a vector storage unit suitable for storing a first test vector corresponding to a first test operation, and transferring the first test vector to a test target; a comparison unit suitable for comparing a first test result to an expected value to output a first test result value, wherein the first test result is transferred from the test target as a result of the first test operation based on the first test vector; and a vector control unit suitable for modifying the first test vector to generate a second test vector corresponding to a second test operation.

The transmission lines may be coupled between an internal circuit and a plurality of external input/output terminals of the semiconductor device.

A test apparatus may further include an expected value control unit suitable for modifying the expected value to correspond to the second test operation.

A part of bits that form the expected value may be modified when the expected value is modified.

A test apparatus may further include a defect detection unit suitable for detecting a defect of a test vector stored in the vector storage unit to generate a control signal for modifying the test vector stored in the vector storage unit.

The first and second test vectors may include detection voltages and a select signal for selectively outputting the detection voltages, and the vector control unit may control the select signal to modify the first test vector.

The detection voltages may have different voltage levels.

DETAILED DESCRIPTION

Figure 1:
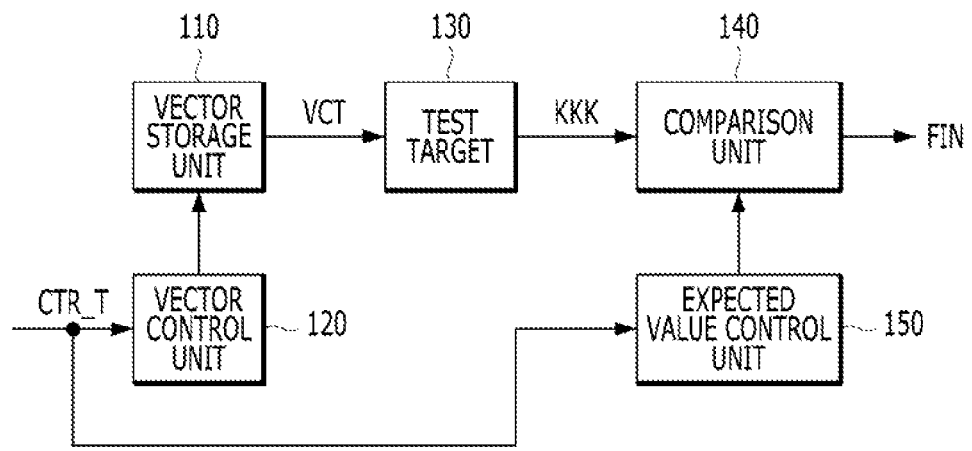
FIG. 1 is a block diagram illustrating a test system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

It is also noted that in this specification, "connected/coupled" refers to one component not only directly coupling another component, but also indirectly coupling another component through an intermediate component. In addition, a singular form may include a plural form as long as it is not specifically mentioned. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

FIG. 1 is a block diagram illustrating a test system in accordance with an embodiment of the present invention.

Referring to FIG. 1, the test system may include a vector storage unit 110, a vector control unit 120, a test target 130, a comparison unit 140, and an expected value control unit 150.

The vector storage unit 110 may store a test vector VCT for a test operation of the test target 130. The test vector VCT may have a variety of forms. The test vector VCT may include plural bits.

The vector control unit 120 may control the test vector VCT stored in the vector storage unit 110 in response to a control signal CTR_T. The control signal CTR_T may be set by a tester. The test vector VCT stored in the vector storage unit 110 may be modified in response to the control signal CTR_T inputted to the vector control unit 120. That is, when the test vector VCT, which is initially stored in the vector storage unit 110, corresponds to a first test operation (hereafter, referred to as 'first test vector'), the first test vector may be modified to generate a test vector corresponding to a second test operation (hereafter, referred to as 'second test vector') in response to the control signal CTR_T. The vector control unit 120 may modify the first test vector into the second test vector by controlling all the bits of the first test vector. Alternatively, the vector control unit 120 may modify the first test vector into the second test vector by controlling a part of the bits of the first test vector. For reference, a test vector which is stored in the test system may belong to the first test vector.

The test target 130 may receive the test vector VCT, perform a test operation corresponding to the test vector VCT, and output a test performance result value KKK. The test target 130 may indicate all circuits which are to be tested. For example, the test target 130 may include a semiconductor device. The test target 130 may also include a semiconductor memory device. In this case, the test vector VCT may be inputted through a command, address, or data path, for example.

The comparison unit 140 may compare the test performance result value KKK to an expected value, and output a test result value FIN. The expected value may indicate a value which is expected as a test performance result. The test result value FIN may include plural bits or one bit which is obtained by analyzing the comparison results between the respective bits and finally determining whether the test target 130 is normal.

The expected value control unit 150 may control the expected value stored in the comparison unit 140 in response to the control signal CTR_T. The expected value stored in the comparison unit 140 may be modified in response to the control signal CTR_T inputted to the expected value control unit 150. That is, when the expected value that is initially stored in the comparison unit 140 corresponds to the first test operation (hereafter, referred to as 'first expected value'), the first expected value may be modified into an expected value corresponding to a second test operation (hereafter, referred to as 'second expected value) in response to the control signal CTR_T. The expected value control unit 150 may modify the first expected value into the second expected value by controlling all the bits of the first expected value. Alternatively, the expected value control unit 150 may modify the first expected value into the second expected value by controlling a part of the bits of the first expected value. For reference, an expected value which is stored in the test system may belong to the first expected value.

The test system in accordance with the embodiment of the present invention may perform a test operation using the first test vector, modify the first test vector to generate the second test vector, and perform a test operation using the second test vector. In particular, the second test vector may be obtained by modifying all the bits of the first test vector, or be obtained by modifying a part of the bits of the first test vector.

Figure 2:
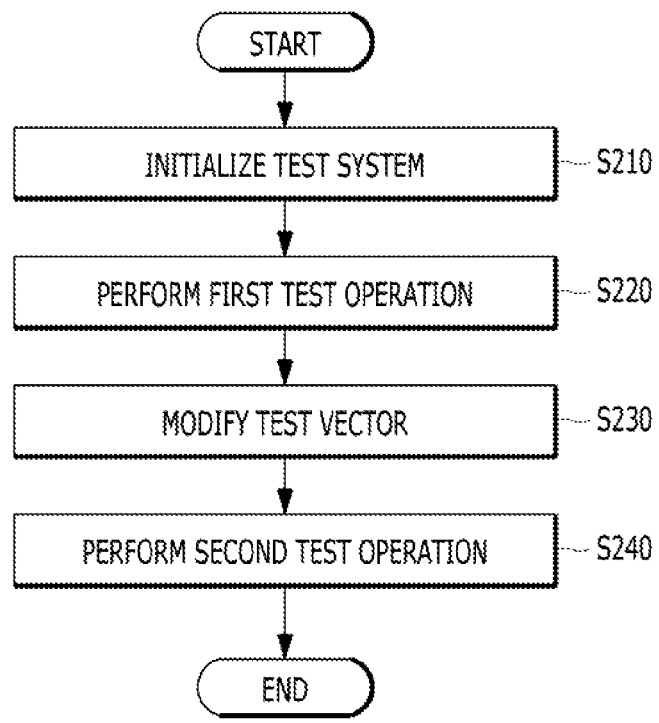
FIG. 2 is a flowchart for describing an operation of the test system illustrated in FIG. 1.

FIG. 2 is a flowchart for describing an operation of the test system illustrated in FIG. 1.

Referring to FIGS. 1 and 2, at step S210, the test system is initialized. That is, the vector storage unit 110, the vector control unit 120, the test target 130, the comparison unit 140, and the expected value control unit 150 included in the test system may be initialized to perform a test operation. In particular, the first test vector, which is initially stored in the vector storage unit 110, and the first expected value, which is initially stored in the expected value control unit 150, may be generated through the initialization operation.

At step S220, the first test operation corresponding to the initialized first test vector may be performed.

At step S230, the first test vector stored in the vector storage unit 110 may be modified to generate a second test vector. When the first test vector includes multiple bits, the first test vector may be modified by controlling all the bits or controlling a part of the bits.

At step S240, a second test operation corresponding to the second test vector modified from the first test vector may be performed.

The test system may generate the first test vector through the initialization operation, and generate the second test vector by modifying the first test vector. This denotes that the test system may perform the test operations corresponding to the first and second vectors, respectively, after one initialization operation. In the embodiment of the present invention, it has been described that the first and second test vectors, that is, two vectors are generated and two test operations corresponding to the two vectors are performed. However, the test system may generate three or more vectors, and perform test operations corresponding to the three or more vectors.

Figure 3:
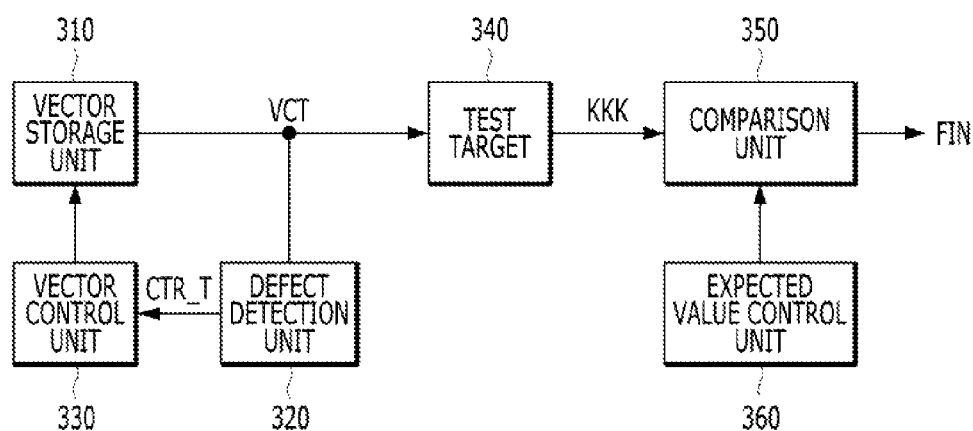
FIG. 3 is a block diagram illustrating a test system in accordance with an embodiment of the present invention.

FIG. 3 is a block diagram illustrating a test system in accordance with an embodiment of the present invention.

Referring to FIG. 3, the test system may include a vector storage unit 310, a defect detection unit 320, a vector control unit 330, a test target 340, a comparison unit 350, and an expected value control unit 360. The vector storage unit 310, the vector control unit 330, the test target 340, the comparison unit 350, and the expected value control unit 360 may correspond to the vector storage unit 110, the vector control unit 120, the test target 130, the comparison unit 140, and the expected value control unit 150 shown in FIG. 1, respectively. That is, the defect detection unit 320 is added to the test system shown in FIG. 1. Thus, the following descriptions will be focused on the defect detection unit 320.

Referring to FIG. 3, the defect detection unit 320 may detect whether a defect occurs in a test vector VCT stored in the vector storage unit 310, and generate a control signal CTR_T according to the detection result. Then, the vector control unit 330 may control the test vector VCT in response to the control signal CTR_T. When the test vector VCT is modified, a part of bits of the test vector VCT, corresponding to the defect, may be repaired. Then, the vector storage unit 310 may output the test vector VCT having the repaired. For reference, the test vector VCT, which is not yet controlled by the control signal CTR_T, may correspond to a first test vector, and the test vector VCT controlled by the control signal CTR_T may correspond to a second test vector.

The test system may detect an unexpected defect, which occurs in the test vector VCT stored in the vector storage unit 310, and correct the detected defect.

Figure 4:
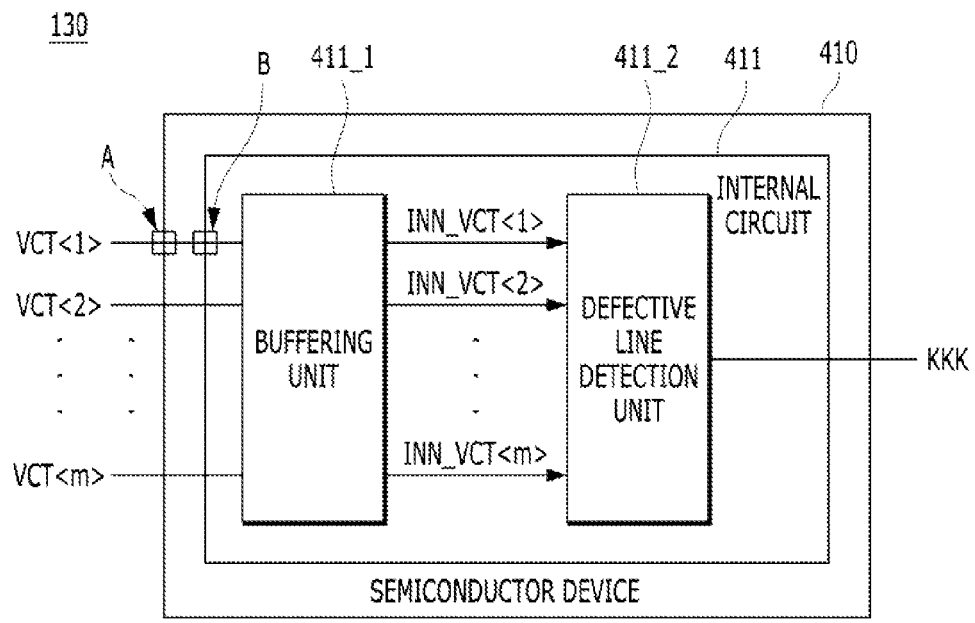
FIG. 4 is a detailed diagram of a test target shown in FIG. 1.

FIG. 4 is a detailed diagram of the test target 130 shown in FIG. 1. For convenience of description, it assumed that the test target 130 is a semiconductor device 410, and a test operation is a test operation for detecting the coupling state of a transmission line in the semiconductor device 410, among a variety of test operations performed using the test vector VCT. In particular, the test operation may correspond to a test operation for detecting the coupling state of a transmission line coupled between a pin and a pad, after a package process. The pin may indicate a component 'A' for coupling the outside and the inside of the semiconductor device 410, and the pad may indicate a component 'B' for coupling the outside and the inside of an internal circuit 411.

Referring to FIG. 4, the semiconductor memory device may include a buffering unit 411_1 and a defective line detection unit 411_2.

The buffering unit 411_1 may buffer and output test vectors VCT<1:m>. The number of bits of the test vectors VCT<1:m> is set to 'm', where 'm' is a natural number. Each of test vectors INN_VCT<1:m> which are output signals of the buffering unit 411_1 may have a predetermined signal level regardless of an input signal level, when the coupling state of the corresponding transmission line is abnormal.

The defective line detection unit 411_2 may detect the coupling states of the transmission lines coupled between the pin and the pad in response to the test vectors INN_VCC<1:m>. For reference, a test performance result value KKK, which is an output signal of the defective line detection unit 411_2, may be provided to the comparison unit 140 shown in FIG. 1, and the test system may compare the test performance result value KKK to an expected value and determine whether the coupling states of the transmission lines are normal.

Figure 5:
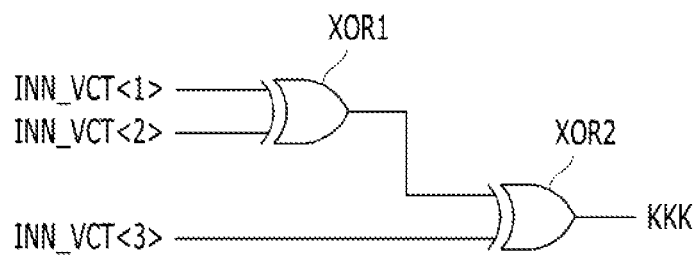
FIG. 5 is a detailed diagram of a defective line detection unit shown in FIG. 4.

FIG. 5 is a detailed diagram of the defective line detection unit 411_2 shown in FIG. 4. For convenience, it is assumed that the number of the test vectors VCT<1:m> is set to 3, and the defective line detection unit 411_2 receives test vectors INN_VCT<1:3> obtained by buffering the test vectors VCT<1:3>.

Referring to FIG. 5, the defective line detection unit 411_2 may include a first exclusive OR (XOR) gate XOR1 and a second XOR gate XOR2. The first XOR gate XOR1 may receive the test vector INN_VCT<1> and the test vector INN_VCT<2>, and the second XOR gate XOR2 may receive an output signal of the first XOR gate XOR1 and the test vector INN_VCT<3>.

For reference, the defective line detection unit 411_2 may differ depending on the circuit design. Although the test performance result value KKK is outputted through the logical combination using the XOR gates, the circuit design may be changed. In particular, the design of the defective line detection unit 411_2 may be changed depending on the number of input terminals and the number of output terminals. When the number of input terminals is equal to the number of output terminals, the defective line detection unit 411_2 may be designed in such a manner that the input terminals are coupled one-to-one to the output terminals.

Hereafter, a simple test operation will be described.

The test vectors INN_VCT<1:3> may have predetermined signal levels according to the test vectors VCT<1:3>. Thus, when the coupling states of the transmission lines corresponding to the test vectors VCT<1:3> are normal, the test performance result value KKK may have an expectable signal level.

When the coupling states of the transmission lines are abnormal, the test performance result value KKK may have a signal level corresponding to the abnormality. However, it may be impossible to recognize which transmission line has an abnormal coupling state, based on the test performance result value KKK obtained through one test operation. Furthermore, when the coupling states of two transmission lines are abnormal in the embodiment of FIG. 5, which includes the XOR gates, the test performance result value KKK may have a signal level corresponding to when the coupling states of the transmission lines are normal. To resolve this concern, the test vectors VCT<1:3> may be modified to obtain an output signal KKK corresponding to the number of all possibilities for the test vectors VCT<1:3>, during a test operation. Through the output signal KKK, it may be possible to detect all the coupling states of the transmission lines.

The test system may modify the test vectors VCT<1:3> to perform a test operation. Thus, the test system may detect the coupling states of the transmission lines.

Figure 6:
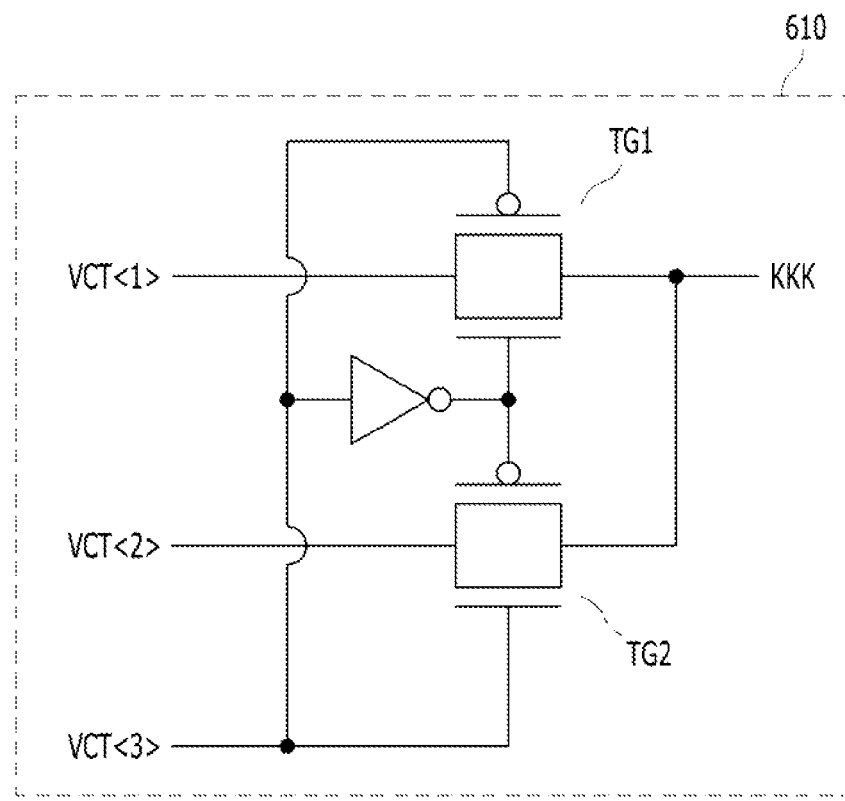
FIG. 6 is a diagram illustrating an internal circuit included in a test target shown in FIG. 1.

FIG. 6 is a block diagram illustrating an internal circuit included in the test target 130 shown in FIG. 1. For reference, the internal circuit 610 may operate without the buffering unit 411_1 shown in FIG. 4, and the defective line detection unit 411_2 may directly receive the test vectors VCT<1:3>. Thus, the internal circuit 610 may correspond to the defective line detection unit. As described above, a test vector may include multiple bits. That is, all the bits of the test vector may have a logical level. However, a test vector to be described below has an analog voltage level. For convenience of description, it is assumed that the number of bits of the test vectors VCT<1:m> is set to 3.

Referring to FIG. 6, the defective line detection unit 610 may include a first selection unit TG1 and a second selection unit TG2. The first selection unit TG1 may selectively output the test vector VCT<1> in response to the test vector VCT<3>, and the second selection unit TG2 may selectively output the test vector VCT<2> in response to the test vector INN_VCT<3>. The test vectors VCT<1> and VCT<2> may serve as detection voltages to be detected through a test operation, and the test vector VCT<3> may serve as a control signal for selecting and outputting a plurality of detection voltages.

Hereafter, a simple test operation will be described. For convenience of description, it is assumed that the test vector VCT<1> has a voltage level of 1V and the test vector VCT<2> has a voltage level of 2V.

First, when the test vector VCT<3> has a logic low level, the test vector VCT<1> having a voltage level of 1V may be outputted through the first selection unit TG1. That is, the test performance result value KKK corresponding to the output signal of the defective line detection unit 610 may have a voltage level of 1V, which indicates that the coupling state of the transmission line corresponding to the test vector VCT<1> is normal. However, when the coupling state of the transmission line corresponding to the test vector VCT<1> is abnormal, the test performance result value KKK may not have a voltage level of 1V.

Then, when the test vector VCT<3> is modified to have a logic high level, the test vector VCT<2> having a voltage level of 2V may be outputted through the second selection unit TG2. That is, the test performance result value KKK may have a voltage level of 2V, which indicates that the coupling state of the transmission line corresponding to the test vector VCT<2> is normal. Similarly, when the coupling state of the transmission line corresponding to the test vector VCT<2> is abnormal, the test performance result value KKK may not have a voltage level of 2V.

In the test system, the test vector may include plural bits corresponding to the detection voltages and the control signal, and the coupling states of the transmission lines may be detected through the test vectors.

It has been described that the test vector VCT<1> and the test vector VCT<2> have different voltage levels. However, the test vectors may include all signals capable of distinguishing the transmission lines.

Figure 7:
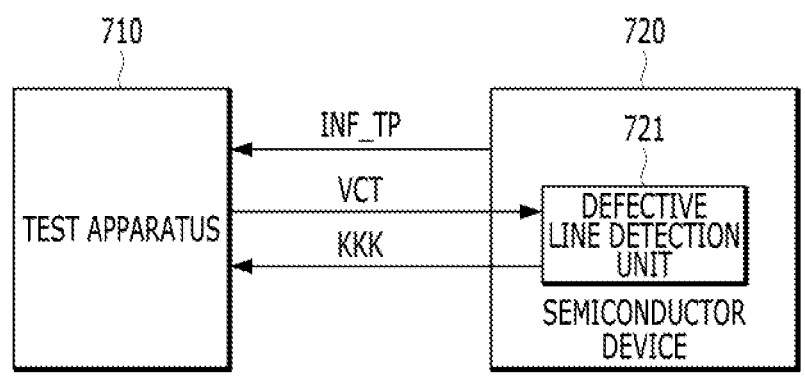
FIG. 7 is a block diagram illustrating a test system in accordance with an embodiment of the present invention.

FIG. 7 is a block diagram illustrating a test system in accordance with an embodiment of the present invention.

Referring to FIG. 7, the test system may include a test apparatus 710 and a semiconductor device 720.

The test apparatus 710 may modify the test vectors VCT in response to design type information INF_TP, and determine whether the coupling state of a line coupled to the semiconductor device 720 are normal, in response to a test performance result value KKK. The design type information INF_TP may correspond to the design of a defective line detection unit 721, to be described below. For example, when the defective line detection unit 721 is designed according to the embodiment of FIG. 5 or 6, the design type information INF_TP may include information on the embodiment of FIG. 5 or 6.

The semiconductor device 720 may include the defective line detection unit 721 for detecting the coupling state of a transmission line coupled thereto. The semiconductor device 720 may include a memory device or non-memory device. The defective line detection unit 721 may be designed according to the embodiment of FIG. 5 or 6, for example.

Hereafter, a simple test operation of the test system will be described. For convenience of description, suppose that the defective line detection unit 721 includes the embodiment of FIG. 5 or 6. For reference, when the defective line detection unit 721 is configured according to the embodiment of FIG. 5, the defective line detection unit 721 may also include the buffering unit 411_1 of FIG. 4.

First, when the defective line detection unit 721 is configured according to the embodiment of FIG. 5, the semiconductor device 720 may transmit design type information INF_TP, indicating that the defective line detection unit 721 is configured according to the embodiment of FIG. 5, to the test apparatus 710. Then, the test apparatus 710 may generate a test vector VCT, corresponding to the embodiment of FIG. 5, in response to the design type information INF_TP. As described above, the test vector VCT in the embodiment of FIG. 5 may include multiple bits. For reference, the test vector generated at this time may correspond to a first test vector. Then, the semiconductor device 720 may perform a test operation according to the test vector VCT. Furthermore, the test performance result value KKK may be provided to the test apparatus 710. Through the test performance result value KKK, the test apparatus 710 may determine whether the coupling state of the transmission line coupled to the semiconductor device 720 is normal.

Then, the test apparatus 710 may generate a test vector VCT by modifying the first test vector according to the design type information INF_TP. For reference, the test vector VCT generated at this time may correspond to a second test vector. Similarly, the semiconductor device 720 may perform a test operation according to the test vector VCT, and the test apparatus 710 may determine whether the coupling state of the transmission line coupled to the semiconductor device 720 is normal, according to the test performance result value KKK.

On the other hand, when the defective line detection unit 721 is configured according to the embodiment of FIG. 6, the semiconductor device 720 may transmit design type information INF_TP, indicating that the defective line detection unit 721 is configured according to the embodiment of FIG. 6, to the test apparatus 710. Then, the test apparatus 710 may generate a test vector VCT corresponding to the embodiment of FIG. 6 in response to the design type information INF_TP. As described above, the test vector VCT in the embodiment of FIG. 6 may include detection voltages and a select signal. The test vector generated at this time may correspond to a first test vector. According to the test performance result value KKK based on the test vector VET, the test apparatus 710 may determine whether the coupling state of the transmission line coupled to the semiconductor device 720 is normal.

Then, the test apparatus 710 may generate a second test vector by modifying the select signal of the first test vector according to the design type information INF_TP. The semiconductor device 720 may perform a test operation according to the test vector VCT, and the test apparatus 710 may determine whether the coupling state of the transmission line coupled to the semiconductor device 720 is normal, according to the test performance result value KKK.

The test system in accordance with the embodiment of the present invention may generate a test vector according to the design type of the detection unit which is designed in the semiconductor device corresponding to a test target, which indicates that the test vector may be modified depending on the design type.

The test system may modify a test vector according to the intention of a tester, and may be used in various places.

Although various embodiments have been described for illustrative purposes, it will be apparent to those skilled in the art that various changes and modifications may be made without departing from the spirit and scope of the invention as defined in the following claims.

For example, the positions and types of the logic gates and transistors included in the above-described embodiments may be implemented in different manners depending on the polarity of an input signal.

What is claimed is:

1. A test system comprising:
a vector storage unit suitable for storing a first test vector corresponding to a first test operation;
a test target suitable for performing the first test operation corresponding to the first test vector stored in the vector storage unit;
a comparison unit suitable for comparing a first test result to an expected value to determine whether the test target is normal, wherein the first test result is transferred from the test target as a result of the first test operation based on the first test vector; and
a vector control unit suitable for modifying the first test vector to generate a second test vector corresponding to a second test operation,
wherein the test target is suitable for performing the second test operation corresponding to the second test vector,
wherein the first and second test vectors include a plurality of detection voltages and a select signal for selectively outputting the detection voltages, and the vector control unit controls the select signal to modify the first test vector.

2. The test system of claim 1, wherein a part of bits that form the first test vector is modified to generate the second test vector.

3. The test system of claim 1, further comprising an expected value control unit suitable for modifying the expected value to correspond to the second test operation.

4. The test system of claim 3, wherein a part of bits that form the expected value is modified when the expected value is modified.

5. The test system of claim 1, further comprising a defect detection unit suitable for detecting a defect of the first test vector stored in the vector storage unit to generate a control signal for modifying the first test vector stored in the vector storage unit to generate the second test vector.

6. The test system of claim 1, wherein the test target includes a plurality of transmission lines for coupling a plurality of external input/output terminals to an internal circuit, and
the internal circuit includes:
a buffering unit suitable for buffering a test vector transmitted through the transmission lines; and
a defective line detection unit suitable for detecting coupling states of the transmission lines based on an output signal of the buffering unit.

7. The test system of claim 1, wherein the detection voltages have different voltage levels.

8. The test system of claim 1, wherein the test target includes a plurality of transmission lines for coupling a plurality of external input/output terminals to an internal circuit, and
the internal circuit includes a selection unit suitable for selectively outputting the detection voltages transmitted through the transmission lines based on the select signal.

9. An operating method of a test apparatus, comprising:
initializing the test apparatus to generate a first test vector;
performing a first test operation corresponding to the first test vector;
modifying the first test vector to generate a second test vector; and
performing a second test operation corresponding to the second test vector,
wherein the first test vector includes a plurality of detection voltages and a select signal for selectively outputting the detection voltages, and the second test vector is obtained by modifying the select signal.

10. The operating method of claim 9, wherein, in the modifying of the first test vector, a part of bits that form the first test vector is modified.

11. The operating method of claim 9, further comprising:
comparing the first test vector to a first expected value to determine whether a test target is normal; and
comparing the second test vector to a second expected value to determine whether the test target is normal.

12. The operating method of claim 11, wherein the first expected value corresponding to the first test operation is generated when the test apparatus is initialized.

13. The operating method of claim 11, further comprising:
generating the second expected value by modifying the first expected value.

14. A test system comprising:
a semiconductor device including a detection unit suitable for receiving a test vector and detecting a coupling state of a transmission line coupled to the semiconductor device, based on the test vector; and a test apparatus suitable for modifying the test vector based on a design type information of the detection unit and, based on a detection result, wherein the test vector includes a plurality of detection voltages and a select signal, and the detection unit outputs a corresponding detection voltage from among the plurality of detection voltages based on the select signal which selects the detection voltages.

15. The test system of claim 14, wherein the test vector includes multiple bits, and the test apparatus modifies defective bits of the test vector to output a repaired test vector.

16. The test system of claim 15, wherein the test apparatus includes a vector control unit suitable for modifying a part of the bits.

17. The test system of claim 15, wherein the test apparatus includes a vector control unit suitable for modifying a select signal.

18. The test system of claim 14, wherein the transmission line is coupled between an internal circuit and a plurality of external input/output terminals of the semiconductor device.

19. A test apparatus comprising:

a vector storage unit suitable for storing a first test vector corresponding to a first test operation, and transferring the first test vector to a test target;

a comparison unit suitable for comparing a first test result to an expected value to determine whether the test target is normal, wherein the first test result is transferred from the test target as a result of the first test operation based on the first test vector; and a vector control unit suitable for modifying the first test vector to generate a second test vector corresponding to a second test operation, wherein the vector storage unit performs the second test operation corresponding to the second test vector, wherein the first and second test vectors include detection voltages and a select signal for selectively outputting the detection voltages, and the vector control unit controls the select signal to modify the first test vector.

20. The test apparatus of claim 19, wherein a part of bits that form the first test vector is modified to generate the second test vector.

21. The test apparatus of claim 19, further comprising an expected value control unit suitable for modifying the expected value to correspond to the second test operation.

22. The test apparatus of claim 21, wherein a part of bits that form the expected value is modified when the expected value is modified.

23. The test apparatus of claim 22, further comprising a defect detection unit suitable for detecting a defect of a test vector stored in the vector storage unit to generate a control signal for modifying the test vector stored in the vector storage unit.

24. The test apparatus of claim 16, wherein the detection voltages have different voltage levels.

* * * * *